United States Patent
Jung et al.

(10) Patent No.: US 8,804,086 B2
(45) Date of Patent: Aug. 12, 2014

(54) ANISOTROPIC CONDUCTIVE FILM, METHOD OF MANUFACTURING THE SAME AND DISPLAY APPARATUS HAVING THE SAME

(75) Inventors: Suk Won Jung, Goyang-si (KR); Woongkwon Kim, Cheonan-si (KR); Daecheol Kim, Hwaseong-si (KR); SungHoon Yang, Seoul (KR); Sang Youn Han, Seoul (KR); Byeonghoon Cho, Seoul (KR); Ki-Hun Jeong, Cheonan-si (KR); Kyung-Sook Jeon, Yongin-si (KR); jung suk Bang, Guri-si (KR)

(73) Assignee: Samsung Display Co., Ltd. (KR)

( * ) Notice: Subject to any disclaimer, the term of this patent is extended or adjusted under 35 U.S.C. 154(b) by 881 days.

(21) Appl. No.: 12/758,824

(22) Filed: Apr. 13, 2010

(65) Prior Publication Data

US 2011/0102385 A1    May 5, 2011

(30) Foreign Application Priority Data

Nov. 5, 2009  (KR) .................. 10-2009-0106624

(51) Int. Cl.
G02F 1/1345    (2006.01)
G02F 1/1339    (2006.01)

(52) U.S. Cl.
USPC ............................. 349/149; 349/152; 349/155

(58) Field of Classification Search
USPC ................... 349/149–152, 155–157
See application file for complete search history.

(56) References Cited

U.S. PATENT DOCUMENTS

| | | | | |
|---|---|---|---|---|
| 7,060,602 B2* | 6/2006 | Saito | ............................. | 438/612 |
| 8,314,916 B2* | 11/2012 | Kim | ............................. | 349/149 |
| 2002/0133129 A1* | 9/2002 | Arias et al. | .................... | 604/272 |
| 2003/0008133 A1* | 1/2003 | Paik et al. | ..................... | 428/332 |
| 2003/0102154 A1* | 6/2003 | Haba | ............................. | 174/257 |
| 2007/0076393 A1* | 4/2007 | Jeong et al. | ................... | 361/767 |
| 2009/0026462 A1* | 1/2009 | Hashiguchi | ..................... | 257/72 |
| 2010/0098996 A1* | 4/2010 | Hwang et al. | .................. | 429/33 |

FOREIGN PATENT DOCUMENTS

| | | | |
|---|---|---|---|
| KR | 1020020054107 A | | 7/2002 |
| KR | 1020050093923 A | | 9/2005 |
| KR | 1020070077739 A | | 7/2007 |
| KR | 100756518 B1 | | 8/2007 |

\* cited by examiner

*Primary Examiner* — Bumsuk Won
*Assistant Examiner* — Charles Chang
(74) *Attorney, Agent, or Firm* — Cantor Colburn LLP

(57) ABSTRACT

An anisotropic conductive film includes a first thin film layer including concave portions, conductive balls arranged in the concave portions, insulating balls disposed on and between the conductive balls and each having a diameter smaller than the conductive balls, and a second thin film layer disposed covering the insulating balls. A display apparatus includes a pad part and a driving chip, which are electrically connected by the anisotropic conductive film.

19 Claims, 6 Drawing Sheets

ANISOTROPIC CONDUCTIVE FILM, METHOD OF MANUFACTURING THE SAME AND DISPLAY APPARATUS HAVING THE SAME

This application claims priority to Korean Patent Application No. 2009-0106624 filed on Nov. 5, 2009, and all the benefits accruing therefrom under 35 U.S.C. §119, the contents of which are herein incorporated by reference in its entirety.

BACKGROUND OF THE INVENTION

1. Field of the Invention

The invention relates to an anisotropic conductive film, a method of manufacturing the anisotropic conductive film, and a display apparatus including the anisotropic conductive film.

2. Description of the Related Art

A liquid crystal display controls a light transmittance of liquid crystals using an electric field to display images. The liquid crystal display includes a display panel in which the liquid crystals are provided and a driving chip used to drive the display panel.

The driving chip is attached to the display panel with an anisotropic conductive film. The anisotropic conductive film includes conductive members (e.g., balls), each having a polymer bead and a conductive metal coated on the polymer bead, to electrically connect the driving chip to the display panel. However, the driving chip is electrically disconnected from the display panel since the conductive balls are irregularly distributed in the anisotropic conductive film.

BRIEF SUMMARY OF THE INVENTION

Embodiments of the invention provide an anisotropic conductive film in which conductive balls are regularly and uniformly distributed.

Embodiments of the invention provide a method of manufacturing the anisotropic conductive film.

Embodiments of the invention provide a display apparatus employing the anisotropic conductive film.

According to an exemplary embodiment, a method of manufacturing an anisotropic conductive film is provided as follows. After a first thin film layer including uniformly disposed concave portions is formed, conductive balls are arranged in the concave portions. Insulating balls, each of which has a diameter smaller than the conductive balls, are arranged on the first thin film layer to cover the conductive balls, and a second thin film layer is disposed to cover the insulating balls.

The insulating balls include a polymer.

Each of the concave portions has a diameter equal to or larger than about 5 micrometers and each of the conductive balls has a diameter smaller than about 5 micrometers.

In arranging the conductive balls in the concave portions, a vibration is applied to the first thin film layer, such that the conductive balls are arranged in the concave portions after arranging the conductive balls on the first thin film layer. In addition, an electric field or a magnetic field may be applied to the first thin film layer to guide the conductive balls to the concave portions.

The first thin film layer is formed by preparing a carrier thin layer on which uniformly disposed concave-convex portions are formed, and coating the first thin film layer on the carrier thin layer along the concave-convex portions. The carrier thin layer may be removed after heating the formed first thin film layer. In addition, the carrier thin layer on which the concave-convex portions are disposed, may be formed by pressing a raw carrier thin layer with a plate on which protrusions are disposed to respectively correspond to the concave portions in the carrier thin layer.

According to an exemplary embodiment, an anisotropic conductive film includes a first thin film layer including uniformly disposed concave portions, conductive balls arranged in the concave portions, insulating balls disposed on and between the conductive balls and each having a diameter smaller than the conductive balls, and a second thin film layer disposed overlapping the insulating balls.

The insulating balls may include a polymer and the conductive balls may include yttria stabilized zirconia ("Ni-YSZ"). Each of the concave portions has a diameter equal to or larger than about 5 micrometers and each of the conductive balls has a diameter smaller than about 5 micrometers.

According to an exemplary embodiment, a display apparatus includes a display panel including a pad part, a driving chip including a bump corresponding to the pad part, and an anisotropic conductive film disposed between the pad part and the driving chip to electrically connect the pad part to the bump. The anisotropic conductive film includes a first thin film layer including uniformly disposed concave portions, conductive balls arranged in the concave portions, insulating balls disposed on and between the conductive balls and each having a diameter smaller than the conductive balls, and a second thin film layer disposed overlapping the insulating balls.

The pad part may include an indium-tin-oxide and the pad part may further include at least one metal conductive layer.

According to the exemplary embodiments, since the driving chip is attached to the pad part with the anisotropic conductive film in which the conductive balls are uniformly distributed, a massing of the conductive balls may be reduced or effectively prevented, thereby reducing defects in the display panel and improving display quality of the display panel. In addition, the uniformly distributed conductive balls of the anisotropic conductive film and the pad part include Ni-YSZ and indium-tin-oxide, respectively, and thus the contact resistance between the pad part and the conductive balls of the anisotropic conductive film is reduced.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION OF THE INVENTION

Figure 1:
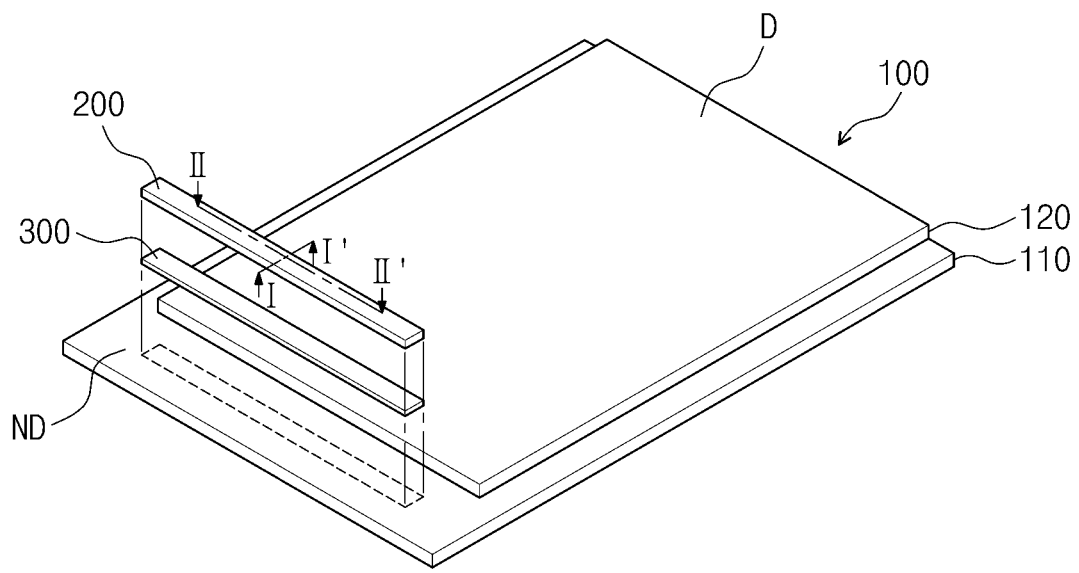
FIG. 1 is an exploded perspective view showing an exemplary embodiment of a display apparatus according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

FIG. 1 is an exploded perspective view showing an exemplary embodiment of a display apparatus according to the invention.

Referring to FIG. 1, a display apparatus includes a display panel 100, a driving chip 200, and an anisotropic conductive film 300.

The display panel 100 includes a thin film transistor substrate 110, a color filter substrate 120, and a liquid crystal layer 130. The display panel 100 includes a display part D on which images are displayed, and a non-display part ND surrounding a portion or all of the display part D. The thin film transistor substrate 110 has an areal size in a plan view of the display panel 100 greater than an areal size of the color filter substrate 120, due to the non-display part ND.

A pad part is disposed in the non-display part ND. The pad part is physically and/or electrically connected to the driving chip 200, where the anisotropic conductive film 300 is disposed between the pad part and the driving chip 200. The pad part may include a gate pad part and a data pad part, and is longitudinally extended along a side (e.g., a transverse side) of the display part D in the plan view of the display panel 100. Although not shown in FIG. 1, the pad part may be disposed in the non-display part ND along a different side (e.g., a longitudinal side) or along multiple sides of the non-display part ND. The gate pad part and the data pad part of the pad part may be disposed on a conductive material and electrically connected to a gate line 111 and a data line 113, respectively.

Figure 2:
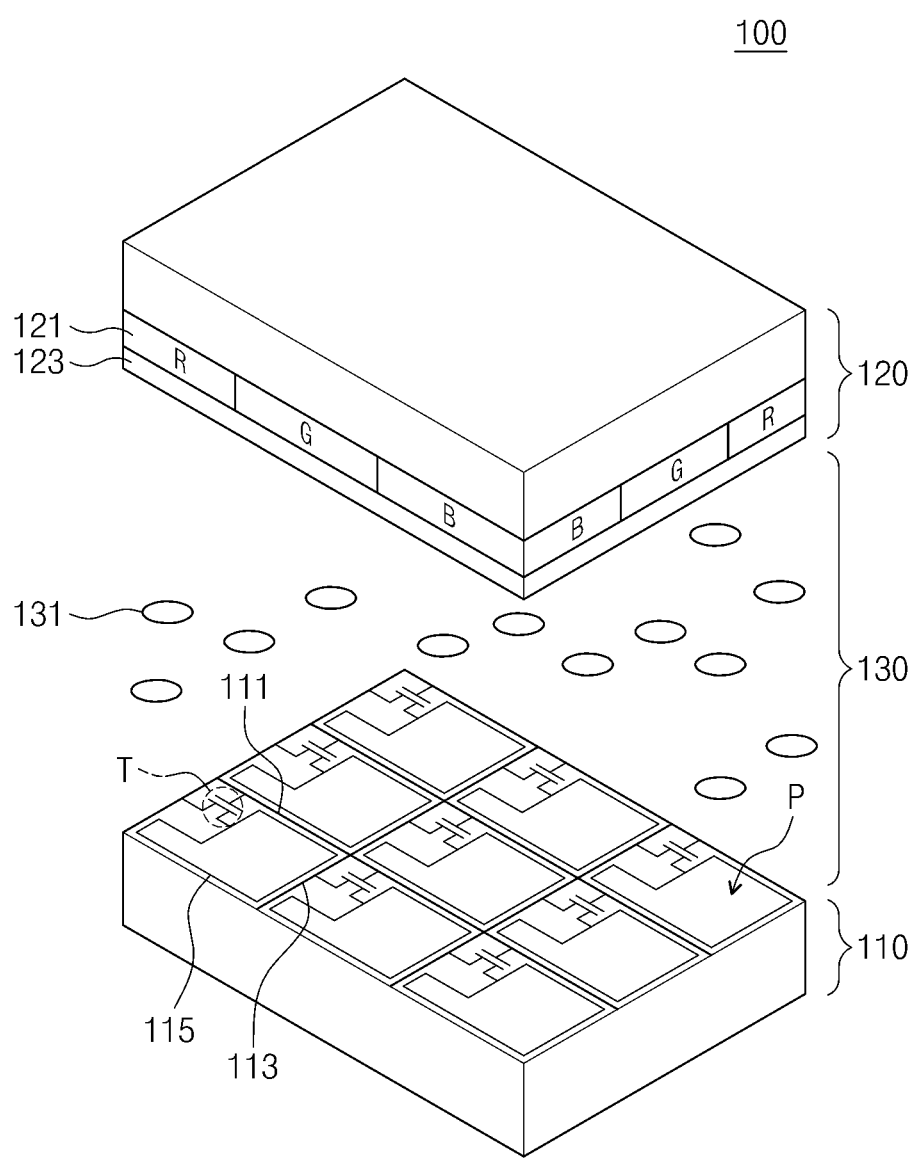
FIG. 2 is a perspective view showing an exemplary embodiment of the display part of the display panel of FIG. 1.

FIG. 2 is a perspective view showing an exemplary embodiment of the display part D of the display panel 100 of FIG. 1.

Referring to FIG. 2, the display part D of the display panel 100 includes the thin film transistor substrate 110, the color filter substrate 120, and the liquid crystal layer 130 disposed between the thin film transistor substrate 110 and the color filter substrate 120.

A plurality of the gate line 111 is disposed on the thin film transistor substrate 110, a plurality of the data line 113 is disposed on the thin film transistor substrate 110 to cross the gate lines 111, and a plurality of a pixel area P is defined in a matrix form on the thin film transistor substrate 110.

Each of the pixel areas P includes a thin film transistor T and a pixel electrode 115. The thin film transistor T is electrically connected to a corresponding gate line 111 of the gate lines 111 and a corresponding data line 113 of the data lines 113, and the pixel electrode 115 is electrically connected to the thin film transistor T. The gate lines 111 apply a gate signal from the driving chip 200 to the thin film transistor T, and the data lines 113 apply an image signal to the pixel electrode 115 via the thin film transistor T.

The color filter substrate 120 includes a color filter member 121 including a plurality of a color filter, and a common electrode 123. The color filter member 121 includes red R, green G, and blue B color filters, and the common electrode 123 is disposed on the color filter member 121, to apply an electric field to the liquid crystal layer 130 with the pixel electrode 115.

When a common voltage is applied to the common electrode 123 and the thin film transistor T is turned on in response to an external signal, the electric field is formed between the pixel electrode 115 and the common electrode 123. Thus, an arrangement of a plurality of a liquid crystal molecule 131 in the liquid crystal layer 130 disposed between the thin film transistor substrate 110 and the color filter substrate 120 varies by the electric field, and light transmittance of the liquid crystal layer 130 with respect to the light varies, thereby displaying desired images.

The driving chip 200 generates a driving signal to drive the thin film transistor T of the thin film transistor substrate 100.

Figure 3A:
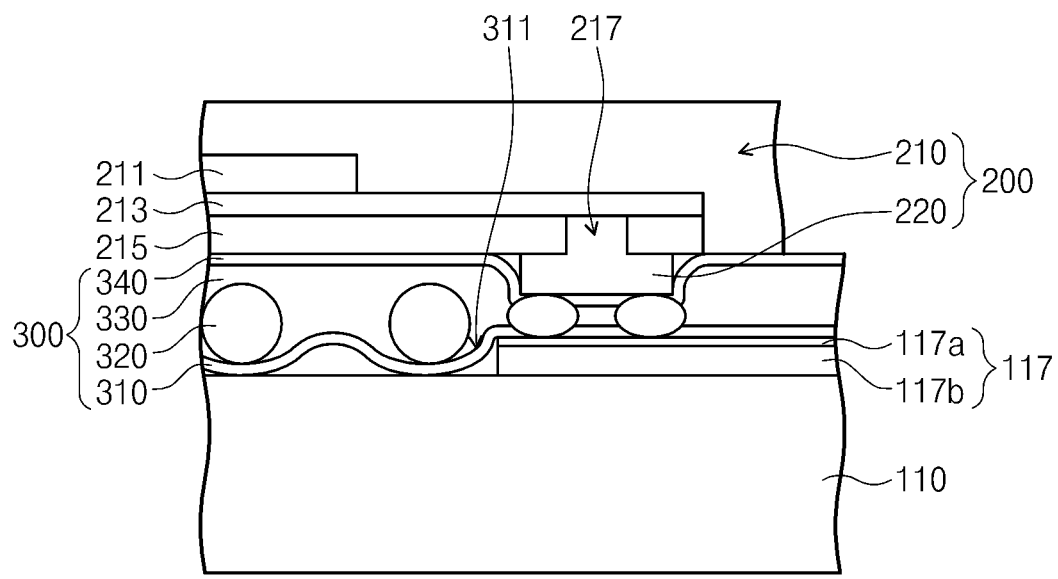
FIG. 3A is a cross-sectional view taken along line I-I' of FIG. 1.
Figure 3B:
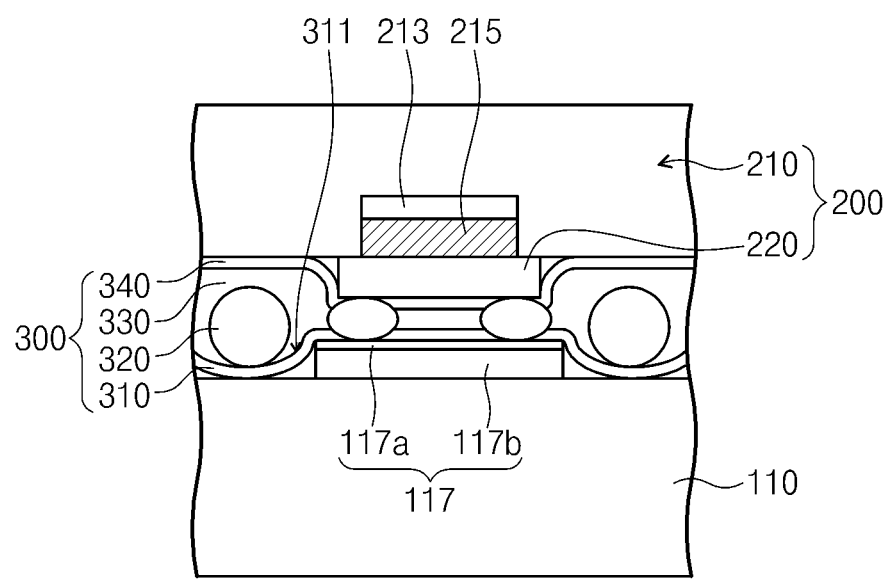
FIG. 3B is a cross-sectional view taken along line II-IF of FIG. 1.

FIG. 3A is a cross-sectional view taken along line I-I' of FIG. 1, and FIG. 3B is a cross-sectional view taken along line II-II' of FIG. 1.

Referring to FIGS. 1, 2, 3A, and 3B, the driving chip 200 includes a body 210, and a bump 220 making contact with a pad part 117.

The body 210 of the driving chip 200 includes a driving circuit 211, a connection wire 213 physically and electrically connected to the driving circuit 211, and a protecting layer 215 disposed on the connection wire 213.

The driving circuit 211 includes integrated circuits and is mounted on an area of the body 210. The driving circuit 211 converts an image signal from an exterior of the driving chip 200 and/or the display panel 100 into the driving signal appropriate to drive the display panel 100, and applies the driving signal to the display panel 100 at appropriate times. In an exemplary embodiment, the driving circuit 211 may be formed by a semiconductor process.

The protecting layer 215 includes an insulating material to protect the driving circuit 211 and the connection wire 213. The protecting layer 215 includes a contact hole 217 disposed extending completely therethrough to expose a portion (e.g., an upper surface) of the connection wire 213. The contact hole 217 is an enclosed opening penetrating a thickness of the protecting layer 215, such that the protecting layer 215 solely defines the enclosed contact hole 217.

The bump 220 is disposed on an upper surface of the protecting layer 215 and directly makes contact with the exposed portion of the connection wire 213 through the contact hole 217. An upper surface of the bump 220, which is opposite to a surface of the bump 220 making contact with the connection wire 213, faces the pad part 117 while the anisotropic conductive film 300 is interposed therebetween.

The bump 220 may include a metal or metal oxide material having a superior conductivity, such as gold, chromium, silver, molybdenum, aluminum, copper, titanium, indium tin oxide, indium zinc oxide, etc., to be electrically connected to the display panel 100. In addition, the bump 220 may include two or more metal materials, or an alloy thereof.

The pad part 117 is disposed on the thin film transistor substrate 110. The pad part 117 may be the gate pad part formed by extending the gate line 111, or the data pad part formed by extending the data lines 113. The pad part 117 includes a conductive material.

In the illustrated exemplary embodiment, the pad part 117 includes an indium-tin-oxide layer 117a and at least one metal conductive layer 117b. When the indium-tin-oxide layer 117a is applied to the pad part 117, a contact resistance between the pad part 117 and a conductive member (e.g., balls) of the anisotropic conductive film 300 is reduced to correspond to about 20% of a contact resistance obtained by applying an indium-zinc-oxide layer to the pad part 117.

The metal conductive layer 117b includes a metal such as gold, chromium, silver, molybdenum, aluminum, copper, titanium, or metal alloy. Although not shown in figures, the metal conductive layer 117b may include a trip layer structure of molybdenum/aluminum/molybdenum. In an exemplary embodiment, the metal conductive layer 117b may be removed from the pad part 117, and thus the pad part 117 may include only the indium-tin-oxide layer 117a.

The anisotropic conductive film 300 is disposed at least directly between the bump 220 and the pad part 117. The anisotropic conductive film 300 includes a first thin film layer 310, a plurality of a conductive member (e.g., balls) 320, a plurality of an insulating member (e.g., balls) 330, and a second thin film layer 340. The first thin film layer 310, each conductive ball 320, each insulating ball 330 and the second thin film layer 340 is a single unitary indivisible member.

The first thin film layer 310 includes an insulating material. In the cross-sectional view of FIG. 3A, the first thin film layer 310 includes a plurality of a concave portion 311, each of which is spaced apart from an adjacent concave portion 311 and is extended towards an inner area of the first thin film layer 310 from an upper surface thereof The concave portions 311 are disposed in a substantially uniform pattern and in a substantially uniform density. The uniform pattern may be defined as having a substantially same spacing between elements and/or a substantially same dimension of the elements. A portion of the first thin film layer 310 may be disposed directly between and contacting the conductive balls 320 and the pad part 117, except where the conductive balls 320 contact the pad part 117 directly.

In the illustrated exemplary embodiment, each of the concave portions 311 has a spherical shape in the cross-sectional and/or plan view of the display panel 100, such that a virtual sphere would be indicated if the profile of the concave portion 311 were continued. A diameter of the concave portion 311 may be equal to or larger than about 5 micrometers, but the diameter should not be limited thereto or thereby.

The conductive balls 320 each include conductive fine particles, each of the particles having a diameter smaller than about 5 micrometers, and are disposed in the concave portions 311, respectively. Since the concave portions 311 of the first thin film layer 310 are arranged uniformly, the conductive balls 320 disposed in the concave portions 311 may be uniformly arranged on the first thin film layer 310. As shown in FIG. 3A, the conductive balls 320 are disposed in the concave portions 311 in a one-to-one correspondence, but they should not be limited thereto or thereby. That is, if each of the conductive balls 320 has a size smaller than each of the concave portions 311, a plurality of the conductive ball 320 may be disposed in one concave portion 311. Even if plural conductive balls 320 are disposed in one concave portion 311, the conductive balls 320 may be distributed on the first thin film layer 310 in an overall uniform density, since the number of the conductive balls 320 disposed in each concave portion 311 is uniform.

The conductive fine particles in the conductive balls 320 may include conductive particles of metal or metal oxide or particles, each including a core coated with metal or metal oxide. In an exemplary embodiment, the metal for the conductive fine particles may be nickel, iron, copper, aluminum, tin, zinc, chromium, cobalt, silver, gold, etc.

In the illustrated exemplary embodiment, particles each including Ni-YSZ (Yittria Stabilized Zirconia) are used as the conductive balls 320. When the Ni-YSZ particles area used as the conductive balls 320, the particles have a hardness higher than when gold (Au) particles or gold-nickel (Au—Ni) particles are used as the conductive balls 320. In addition, the contact resistance between the pad part 117 and the conductive balls 320 tends to be increased according to a time lapse. When the Ni-YSZ particles area used as the conductive balls 320, increasing rate of the contact resistance is remarkably reduced by about 1/10 compared with when gold (Au) particles or gold-nickel (Au—Ni) particles are used as the conductive balls 320.

The insulating balls 330 are disposed between the conductive balls 320, such that the insulating balls 330 completely occupy an area (e.g., are packed) between the conductive balls 320, the first thin film layer 310 and the second thin film layer 340. In FIGS. 3A and 3B, the insulating balls 330 packed (e.g., appearing to be a single continuous member) in the first and second thin film layers 310 and 340 have been shown, but each of the insulating balls 330 may have a discrete and individual substantially spherical shape.

Each of the insulating balls 330 has a diameter smaller than a diameter of each of the conductive balls 320, and includes an insulating material. Accordingly, the insulating balls 330 filled between the conductive balls 320 may reduce or effectively prevent the conductive balls 320 from massing (e.g., collecting).

The second thin film layer 340 is disposed on the conductive balls 320 and the insulating balls 330. A portion of the second thin film layer 340 may be disposed directly between and contacting the conductive balls 320 and the bump 220, except where the conductive balls 320 contact the bump 220 directly.

In the illustrated exemplary embodiment, an insulating polymer may be used as the insulating material for the first thin film layer 310, the insulating balls 330, and/or the second thin film layer 340. A rubber resin that becomes softened by heat pressing and becomes hardened at a specific temperature may be used as the insulating polymer. The rubber resin may be a polymer obtained by polymerizing a commercial resin, such as acrylonitrile resin, styrene butadiene resin, neoprene resin, styreneacrylonitrile resin, butadiene resin, with the rubber resin.

The first thin film layer 310, the insulating balls 330, and/or the second thin film layer 340 may further include a polymer resin such as thermoplastic polymer resin, thermosetting polymer resin, radical-polymerized polymer resin, etc. In detail, the thermoplastic polymer resin may be styrene butadiene resin, ethylene vinyl resin, ester resin, silicone resin, phenoxy resin, acryl resin, amide resin, or vinylbutyral resin. The thermosetting resin may be epoxy resin, phenol resin, or melamine resin, etc. The radical-polymerized resin may be methylacrylate, ethylacrylate, bisphenol A ethylacrylate modified diacrylate, etc. In addition, the insulating polymer may further include filler, softener, accelerant, colorant, flame resistant agent, light stabilizer, crosslink agent, or polymerization preventing agent.

Referring to FIGS. 3A and 3B, the conductive balls 320 disposed between the bump 220 and the pad part 117 make direct contact with both the bump 220 and the pad part 117. The direct contact is a result of the first thin film layer 310, the insulating balls 330, and the second thin film layer 340 being softened by heat pressing while attaching the driving chip 200 and the thin film transistor substrate 110 to each other. Thus, the driving circuit 211 may be electrically connected to the pad part 117, thereby applying the signal to the pad part 117 from the driving circuit 211.

As described above, the signal from the driving circuit 211 is provided to the display panel 100 through the connection wire 213 and the bump 220 to display the images, so that reliability of the electrical connection between the driving chip 200 and the display panel 100 of the display apparatus may be improved. Since the uniformly disposed conductive balls 320 make direct electrical and physical contact with the bump 220 and the pad part 117, an electrical disconnection of the driving chip from the display panel is further reduced or effectively prevented.

FIGS. 4A to 4G are views showing an exemplary embodiment of a manufacturing process of an anisotropic conductive film according to the invention.

Figure 4A:
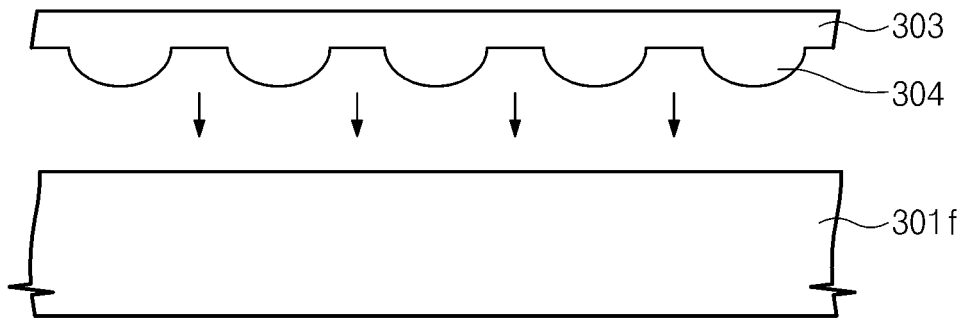
FIGS. 4A to 4G are views showing an exemplary embodiment of a manufacturing process of an anisotropic conductive film according to the invention.
Figure 4B:
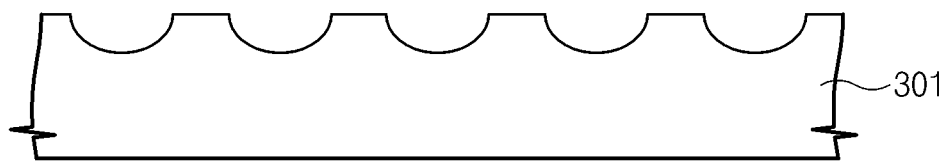

A carrier thin layer 301 on which concave-convex portions are formed is prepared. The carrier layer 301 is used to support the anisotropic conductive film 300 and form the concave portions 311 of the first thin film layer 310 of the anisotropic conductive film 300. As shown in FIGS. 4A and 4B, the carrier thin layer 301 is formed by pressing (indicated by the downward pointing arrows in FIG. 4A) an upper surface of a raw carrier thin layer 301f with a plate 303 on which protrusions 304 are disposed to correspond to the concave portions 311. In FIG. 4A, the protrusions 304 have a semi-spherical shape in a cross-section, but the shape should not be limited thereto or thereby. That is, the protrusions 304 may have various shapes according to the concave portions 311.

Figure 4C:
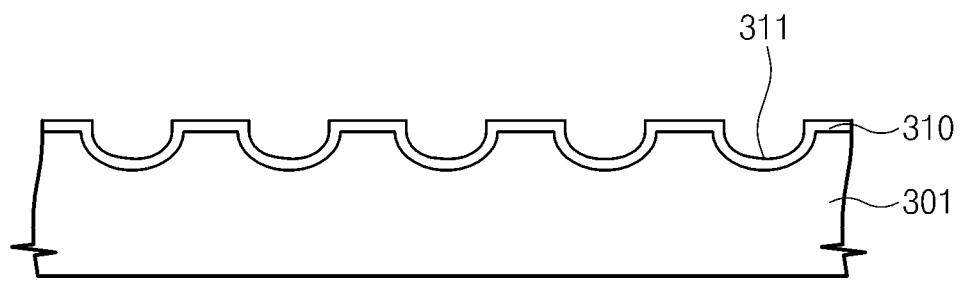

As shown in FIG. 4C, an insulating material is deposited on the carrier thin layer 301 on which the concave-convex portions are formed, to form the first thin film layer 310. The insulating material is deposited on a surface of the carrier thin layer 301, so that the first thin film layer 310 is formed to take on the profile of the concave-convex portions and include the concave portions 311. In the illustrated exemplary embodiment, each of the concave portions 311 has a diameter equal to or larger than about 5 micrometers.

Figure 4D:
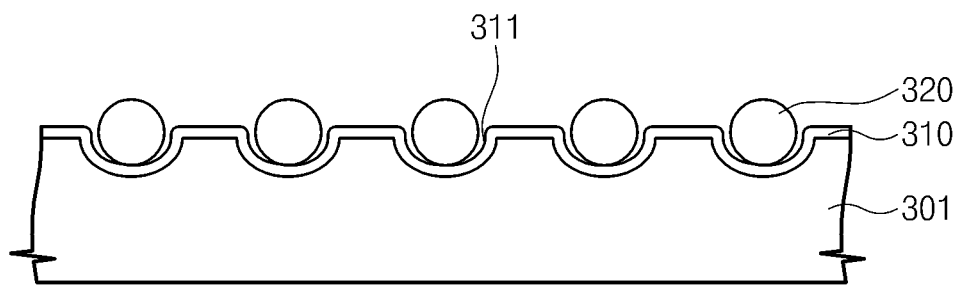

Referring to FIG. 4D, the conductive member (e.g., balls) 320 are arranged on the first thin film layer 310 in which the concave portions 311 are formed. The conductive balls 320 include Ni-YSZ, but the material included in the conductive balls 320 should not be limited thereto or thereby. Each of the conductive balls 320 may have the diameter smaller than about 5 micrometers. The conductive balls 320 may be initially disposed on an upper horizontal surface and/or an upper surface within the concave portions 311.

In order to arrange the conductive balls 320 on the concave portions 311, the conductive balls 320 are arranged on the first thin film layer 310, and then vibration or shock is applied to the carrier thin layer 301 and/or the first thin film layer 310, to position the conductive balls 320 on the concave portions 311, such as from the horizontal upper surfaces. To this end, the carrier thin layer 301 and the first thin film layer 310 may be moved (e.g., swung) in a horizontal direction. As a result, the conductive balls 320 move toward the concave portions 311, thereby stably positioning the conductive balls 320 on the concave portions 311.

In an alternative exemplary embodiment, an electric field and/or a magnetic field may be applied to the carrier thin layer 301 and the first thin film layer 310. When applying the electric field or the magnetic field to the carrier thin layer 301 and the first thin film layer 310, the conductive balls 320 have a mobility in a specific direction since the conductive balls 320 have conductivity due to the electric field or the magnetic field. Accordingly, if the electric field or the magnetic field is applied such that the conductive balls 320 have the downward mobility, the conductive balls 320 may be arranged on the concave portions 311, such as from the horizontal upper surfaces of the first thin film layer 310.

Figure 4E:
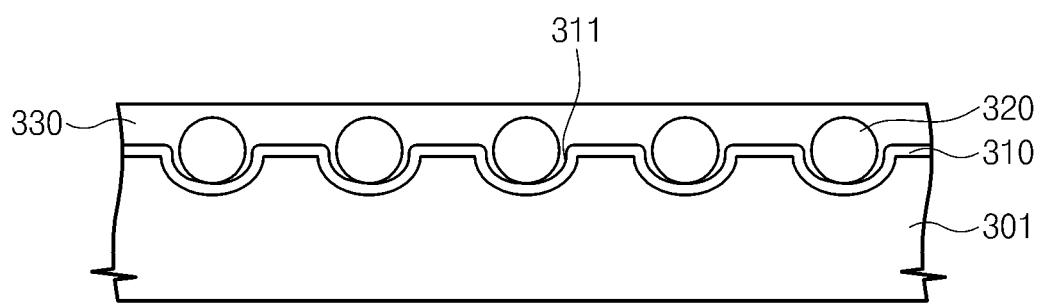

As shown in FIG. 4E, the insulating member (e.g., balls) 330, each having the diameter smaller than the conductive balls 320, are deposited on the first thin film layer 310 on which the conductive balls 320 are arranged, to fill spaces between the conductive balls 320. In this case, the insulating balls 330 are deposited to cover the conductive balls 330. The insulating balls 330 may collectively form a plurality of discrete members, or may collectively form a single unitary indivisible member. The insulating balls 330 are disposed in an entire of an area between the conductive balls 320 and the first thin film layer 310.

Figure 4F:
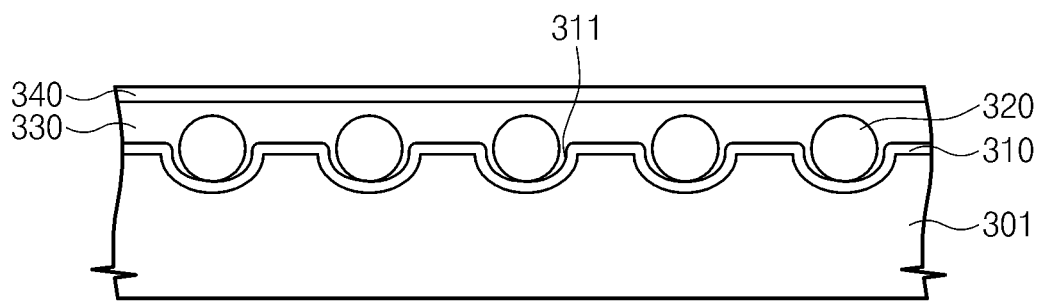

Referring to FIG. 4F, the second thin film layer 340 is formed on the insulating balls 330. The second thin film layer 340 may include the insulating material.

Figure 4G:
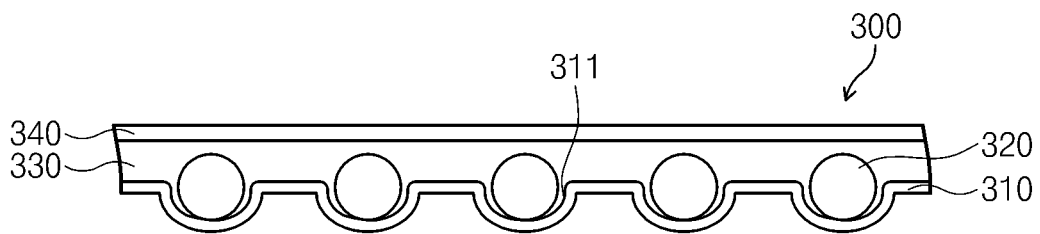

As shown in FIG. 4G, the carrier thin layer 301 is removed after heating the first thin film layer 310 and the carrier thin layer 301, to finally form the anisotropic conductive film 300.

As described above, since the conductive balls 320 are uniformly distributed on the first thin film layer 310 of the anisotropic conductive film 300, such as by using the uniformly formed concave portions 311, a massing of the conductive balls 320 may be reduced or effectively prevented, to thereby reduce defects of the display apparatus. Since a massing of the conductive balls 320 distributed in the anisotropic conductive film 300 is reduced or effectively prevented, an electrical disconnection of a driving chip and a display panel connected to each other by the anisotropic conductive film 300 is reduced or effectively prevented.

A anisotropic conductive film 300 including the uniformly disposed conductive members 320, may be formed by defining a uniform location of the concave portions 311 in which the conductive members 320 are subsequently arranged, in a forming process of the anisotropic conductive film 300. The uniformly arranged conductive members 320 disposed in the concave portions 311 of the final anisotropic conductive film 300, is considered a structural characteristic of the final anisotropic conductive film 300. Since the uniform arrangement of the conductive members 320 is imparted by defining a uniform location of the concave portions 311 during a manufacturing process of the anisotropic conductive film 300, such process using the uniform location of the concave portions 311 is considered to impart the distinct structural characteristic of the uniformly arranged conductive members 320 of the final anisotropic conductive film 300.

Figure 5:
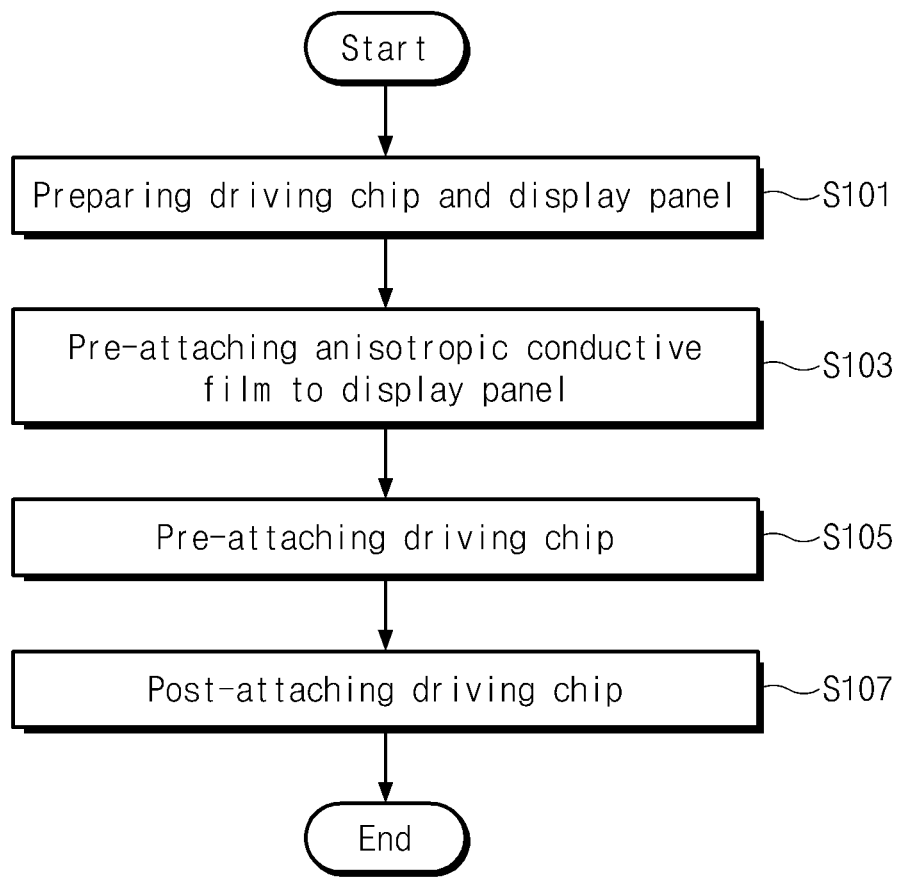
FIG. 5 is a flowchart illustrating an exemplary embodiment of a method of connecting a driving chip with a display panel using an anisotropic conductive film.

FIG. 5 is a flowchart illustrating an exemplary embodiment of a method of connecting the driving chip 200 to the thin film transistor substrate 110 with the anisotropic conductive film 300.

Referring to FIGS. 1, 3A, 3B, and 5, a method of manufacturing the display apparatus may include preparing the driving chip 200 and the display panel 100 (S101) as discrete and separate members from each other, and separate from other elements of the display apparatus. After forming the individual members, the driving chip 200 is attached to the display panel 100 (S103, S105, and S107).

In order to form the discrete driving chip 200, the driving circuit 211 is disposed on the body 210, and the bump 220 is disposed to be electrically and/or physically connected to the driving circuit 211.

In an exemplary embodiment, the driving circuit 211 may be formed by the semiconductor process including plural photolithography processes. The connection wire 213 is disposed on and connected to the driving circuit 211 including the conductive material, and the protecting layer 215 including the insulating material is disposed on the connection wire 213. The protecting layer 215 is provided with the contact hole 217 through which the portion of the connection wire 213 is exposed. The bump 220 is disposed on and overlapping a portion of the protecting layer 215 and connected to the exposed portion of the connection wire 213 through the contact hole 217. In an exemplary embodiment, the bump 220 may be formed by a printing method or a photolithography method, but the forming of the bump 220 should not be limited thereto or thereby.

The discrete display panel 100 on which the pad part 117 is disposed is prepared (S101).

The anisotropic conductive film 300 is pre-attached to the pad part 117 of the display panel 100, such as with heating and/or pressing the anisotropic conductive film 300 to the pad part 117 (S103). The first thin film layer 310, the second thin film layer 340, and the insulating balls 330 of the anisotropic conductive film 300 are softened by the heat pressing while attaching the anisotropic conductive film 300 to the pad part 117.

The driving chip 200 is pre-attached to the anisotropic conductive film 300 (S105). The driving chip 200 is disposed on an opposite side of the anisotropic film 300 from the pad part 117.

After pre-attaching the driving chip 200 to the anisotropic conductive film 300, the driving chip 200 is subsequently post-attached toward the pad part 117, to allow the conductive balls 320 to make direct contact with both the bump 220 of the driving chip 200 and the pad part 117.

In the post-attaching process, the first thin film layer 310, the second thin film layer 340, and the insulating balls 330 of the anisotropic conductive film 300 are expelled outward (e.g., away from the conductive balls 320), and thus the conductive balls 320 make direct electrical and physical contact with the bump 220 and the pad part 117 by exerting an external pressure in at least the post-attaching process.

When the anisotropic conductive film 300 initially softened by the heat is subsequently hardened, the attachment between the driving chip 200 and the pad part 117 of the thin film transistor substrate 110 may be maintained. Since a massing of the conductive balls 320 distributed in the anisotropic conductive film 300 is reduced or effectively prevented in a process of forming the anisotropic conductive film 300, and since the conductive balls 320 make direct electrical and physical contact with the bump 220 and the pad part 117 in a process of forming the display apparatus, an electrical disconnection of the driving chip from the display panel is further reduced or effectively prevented.

As described above, since the driving chip is attached to the pad part with the anisotropic conductive film in which the conductive balls are uniformly distributed, a massing of the conductive balls may be reduced or effectively prevented, thereby reducing defects in the display panel and improving display quality of the display panel. In addition, the conductive balls of the anisotropic conductive film and the pad part include Ni-YSZ and indium-tin-oxide, respectively, and thus the contact resistance between the pad part and the conductive balls of the anisotropic conductive film is respectively reduced.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A method of manufacturing an anisotropic conductive film, the method comprising:
providing an insulating first thin film layer and concave portions defined therein;

arranging conductive balls in the concave portions;

arranging insulating balls each having a diameter smaller than the conductive balls, on the first thin film layer and the conductive balls;

providing an insulating second thin film layer spaced apart from the conductive balls, to dispose an entirety of the conductive and insulating balls between the insulating first and second thin film layers; and exposing the conductive balls from the insulating first and second thin film layers, after the providing the insulating second thin film layer.

2. The method of claim 1, wherein
the conductive balls comprise yittria stabilized zirconia (Ni-YSZ), and
the insulating balls comprise a polymer.

3. The method of claim 1, wherein the arranging conductive balls comprises:
arranging the conductive balls on the first thin film layer; and
applying a vibration to the first thin film layer and moving the conductive balls to be arranged in the concave portions.

4. The method of claim 3, wherein the arranging conductive balls further comprises applying an electric field or a magnetic field to the first thin film layer.

5. The method of claim 1, wherein
each of the concave portions has a diameter equal to or larger than about 5 micrometers, and
each of the conductive balls has a diameter smaller than about 5 micrometers.

6. The method of claim 1, wherein the forming a first thin film layer comprises:
preparing a carrier thin layer on which concave-convex portions are disposed; and
coating the first thin film layer on the carrier thin layer along the concave-convex portions.

7. The method of claim 6, further comprising removing the carrier thin layer.

8. The method of claim 7, further comprising, prior to removing the carrier thin layer, heating the first thin film layer.

9. The method of claim 6, wherein the carrier thin layer on which the concave-convex portions are disposed is formed by pressing a raw carrier thin layer with a plate on which protrusions are disposed to respectively correspond to the concave portions.

10. An anisotropic conductive film comprising:
an insulating first thin film layer and concave portions defined therein;
an insulating second thin film layer facing the insulating first thin film layer;
conductive balls in the concave portions, between the insulating first and second thin film layers, and spaced apart from the insulating second thin film layer; and
insulating balls disposed on and between the conductive balls, disposed between the insulating first and second thin film layers, and each having a diameter smaller than the conductive balls,
wherein the insulating first thin film layer exposes a portion of the conductive balls to outside the anisotropic conductive film.

11. The anisotropic conductive film of claim 10, wherein the insulating balls comprise a polymer.

12. The anisotropic conductive film of claim 10, wherein the conductive balls comprise yittria stabilized zirconia (Ni-YSZ).

13. The anisotropic conductive film of claim 10, wherein
each of the concave portions has a diameter equal to or larger than about 5 micrometers, and
each of the conductive balls has a diameter smaller than about 5 micrometers.

14. A display apparatus comprising:
a display panel including a pad part;
a driving chip including a bump corresponding to the pad part; and
an anisotropic conductive film disposed between the pad part and the driving chip, and electrically connecting the pad part to the bump,
wherein the anisotropic conductive film comprises:
an insulating first thin film layer including concave portions;
an insulating second thin film layer facing the insulating first thin film layer;
conductive balls in the concave portions, between the insulating first and second thin film layers, and spaced apart from the insulating second thin film layer; and
insulating balls disposed on and between the conductive balls, disposed between the insulating first and second thin film layers, and each having a diameter smaller than the conductive balls;
wherein
the insulating first thin film layer exposes the conductive balls disposed overlapping both the bump of the driving chip and the pad part of the display panel, to the pad part, and
the conductive balls disposed overlapping both the bump of the driving chip and the pad part of the display panel directly contact both the bump and the pad part.

15. The display apparatus of claim 14, wherein the insulating balls comprise a polymer.

16. The display apparatus of claim 14, wherein the conductive balls comprise yittria stabilized zirconia (Ni-YSZ).

17. The display apparatus of claim 16, wherein the pad part comprises an indium-tin-oxide.

18. The display apparatus of claim 17, wherein the pad part further comprises at least one metal conductive layer.

19. The display apparatus of claim 14, wherein
each of the concave portions has a diameter equal to or larger than about 5 micrometers, and
each of the conductive balls has a diameter smaller than about 5 micrometers.

* * * * *